United States Patent
Yang et al.

(10) Patent No.: US 9,941,125 B2
(45) Date of Patent: Apr. 10, 2018

(54) METHOD FOR INTEGRATED CIRCUIT PATTERNING

(71) Applicant: Taiwan Semiconductor Manufacturing Company, Ltd., Hsin-Chu (TW)

(72) Inventors: Tsung-Lin Yang, Hsin-Chu (TW); Hua Feng Chen, Hsinchu (TW); Kuei-Shun Chen, Hsinchu (TW); Min-Yann Hsieh, Hsin-Chu (TW); Po-Hsueh Li, Taichung (TW); Shih-Chi Fu, Hsinchu County (TW); Yuan-Hsiang Lung, Hsinchu (TW); Yan-Tso Tsai, Hsin-Chu (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 165 days.

(21) Appl. No.: 14/841,173

(22) Filed: Aug. 31, 2015

(65) Prior Publication Data
US 2017/0062222 A1  Mar. 2, 2017

(51) Int. Cl.
*H01L 21/311* (2006.01)
*H01L 21/265* (2006.01)
(Continued)

(52) U.S. Cl.
CPC .... *H01L 21/26586* (2013.01); *H01L 21/0332* (2013.01); *H01L 21/0337* (2013.01);
(Continued)

(58) Field of Classification Search
CPC .............................. H01L 21/302; H01L 21/308
See application file for complete search history.

(56) References Cited

U.S. PATENT DOCUMENTS 4,438,556 A * 3/1984 Komatsu ........... H01L 21/32137
257/E21.312
5,300,445 A * 4/1994 Oku .................... H01L 21/0279
257/E21.032
(Continued)

FOREIGN PATENT DOCUMENTS

CN    1363859      8/2002
DE   10163346      7/2003
(Continued)

OTHER PUBLICATIONS

Nathalie Cagnat et al., "Defect Behavior in $BF_2$ Implants for S/D Applications as a Function of Ion Beam Characteristics," ION Implantation Technology, 2006, 4 pages, American Institute of Physics.

(Continued)

*Primary Examiner* — Jamie C Niesz
(74) *Attorney, Agent, or Firm* — Haynes and Boone, LLP

(57) ABSTRACT

A method of patterning a substrate includes forming a hard mask layer over the substrate; forming a first material layer over the hard mask layer; and forming a trench in the first material layer. The method further includes treating the hard mask layer with an ion beam through the trench. An etching rate of a treated portion of the hard mask layer reduces with respect to an etching process while an etching rate of untreated portions of the hard mask layer remains substantially unchanged with respect to the etching process. After the treating of the hard mask layer, the method further includes removing the first material layer and removing the untreated portions of the hard mask layer with the etching process, thereby forming a hard mask over the substrate. The method further includes etching the substrate with the hard mask as an etch mask.

20 Claims, 6 Drawing Sheets

(51) Int. Cl.
- *H01L 21/308* (2006.01)
- *H01L 21/302* (2006.01)
- *H01L 21/266* (2006.01)
- *H01L 21/306* (2006.01)
- *H01L 21/31* (2006.01)
- *H01L 21/033* (2006.01)
- *H01L 21/3213* (2006.01)
- *H01L 21/3215* (2006.01)

(52) U.S. Cl.
CPC ........ *H01L 21/266* (2013.01); *H01L 21/2658* (2013.01); *H01L 21/302* (2013.01); *H01L 21/308* (2013.01); *H01L 21/3081* (2013.01); *H01L 21/3085* (2013.01); *H01L 21/3086* (2013.01); *H01L 21/30608* (2013.01); *H01L 21/31* (2013.01); *H01L 21/31111* (2013.01); *H01L 21/32134* (2013.01); *H01L 21/32155* (2013.01)

(56) References Cited

U.S. PATENT DOCUMENTS

| | | | |
|---|---|---|---|
| 8,216,767 B2 | 7/2012 | Wang et al. | |
| 8,323,870 B2 | 12/2012 | Lee et al. | |
| 8,580,117 B2 | 11/2013 | Kao et al. | |
| 8,637,344 B2 | 1/2014 | Kummell et al. | |
| 8,658,344 B2 | 2/2014 | Wang et al. | |
| 8,715,919 B2 | 5/2014 | Chang et al. | |
| 8,741,551 B2 | 6/2014 | Wu et al. | |
| 8,906,595 B2 | 12/2014 | Liu et al. | |
| 8,932,799 B2 | 1/2015 | Wu et al. | |
| 8,936,903 B2 | 1/2015 | Chang et al. | |
| 9,012,132 B2 | 4/2015 | Chang | |
| 9,028,915 B2 | 5/2015 | Chang et al. | |
| 9,065,001 B2 | 6/2015 | Jiang et al. | |
| 2002/0173142 A1 | 11/2002 | Vanhaelemeersch et al. | |
| 2005/0106861 A1* | 5/2005 | Fehlhaber | B81C 1/00396 438/659 |
| 2011/0020753 A1* | 1/2011 | Clevenger | H01L 21/3086 430/313 |
| 2011/0300711 A1 | 12/2011 | Martin et al. | |
| 2013/0323641 A1 | 12/2013 | Chang | |
| 2014/0011133 A1 | 1/2014 | Liu et al. | |
| 2014/0017615 A1 | 1/2014 | Chang | |
| 2014/0017616 A1 | 1/2014 | Chang | |
| 2014/0024215 A1 | 1/2014 | Cheng et al. | |
| 2014/0117563 A1 | 5/2014 | Yu et al. | |
| 2014/0272709 A1 | 9/2014 | Liu et al. | |
| 2014/0272726 A1 | 9/2014 | Chang | |
| 2015/0037948 A1* | 2/2015 | Li | H01L 29/66825 438/257 |

FOREIGN PATENT DOCUMENTS

| | | | | |
|---|---|---|---|---|
| DE | 103 02 544 | * | 8/2004 | ........... H01L 21/308 |
| DE | 10302544 | | 8/2004 | |
| DE | 10341321 | | 4/2005 | |
| TW | 200707083 | | 2/2007 | |
| TW | 201403243 | | 1/2014 | |
| TW | 201517168 | | 5/2015 | |

OTHER PUBLICATIONS

U.S. Appl. No. 14/212,708, filed Mar. 14, 2014, by inventors Yen-Cheng Lu, Shu-Hao Chang, Shinn-Sheng Yu, Jui-Ching Wu, Jeng-Horng Chen, and Anthony Yen for "Method for Integrated Circuit Patterning," 18 pages of text, 7 pages of drawings.

U.S. Appl. No. 14/645,047, filed Mar. 11, 2015, by inventors Chih-Tsung Shih, Shinn-Sheng Yu, Jeng-Horng Chen, and Anthony Yen for "Method for Integrated Circuit Patterning," 17 pages of text, 13 pages of drawings.

* cited by examiner

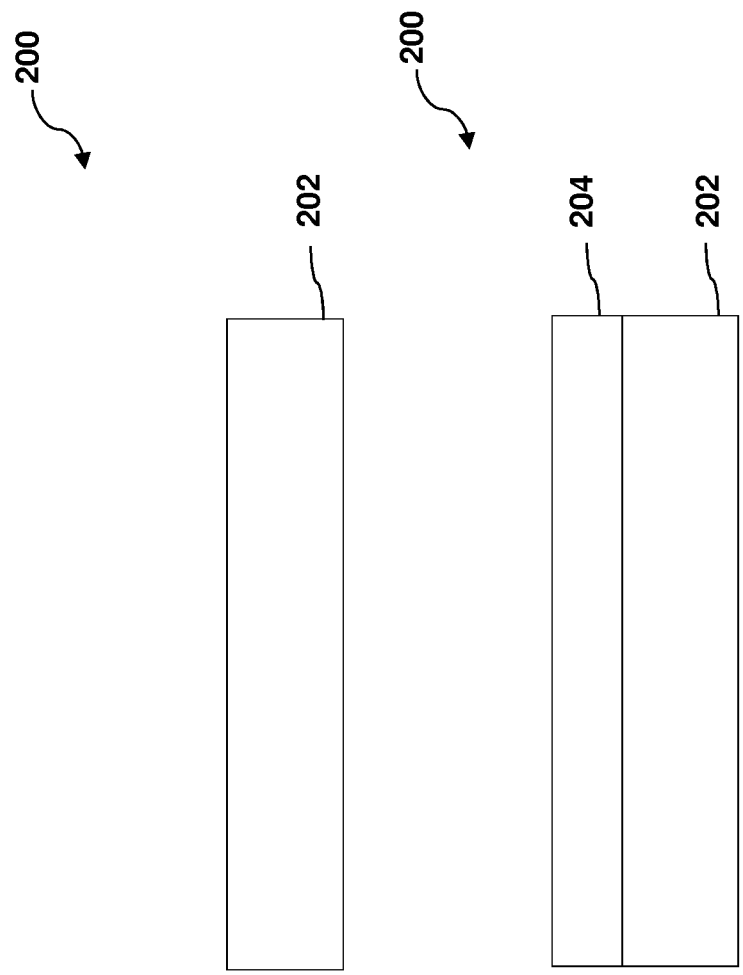

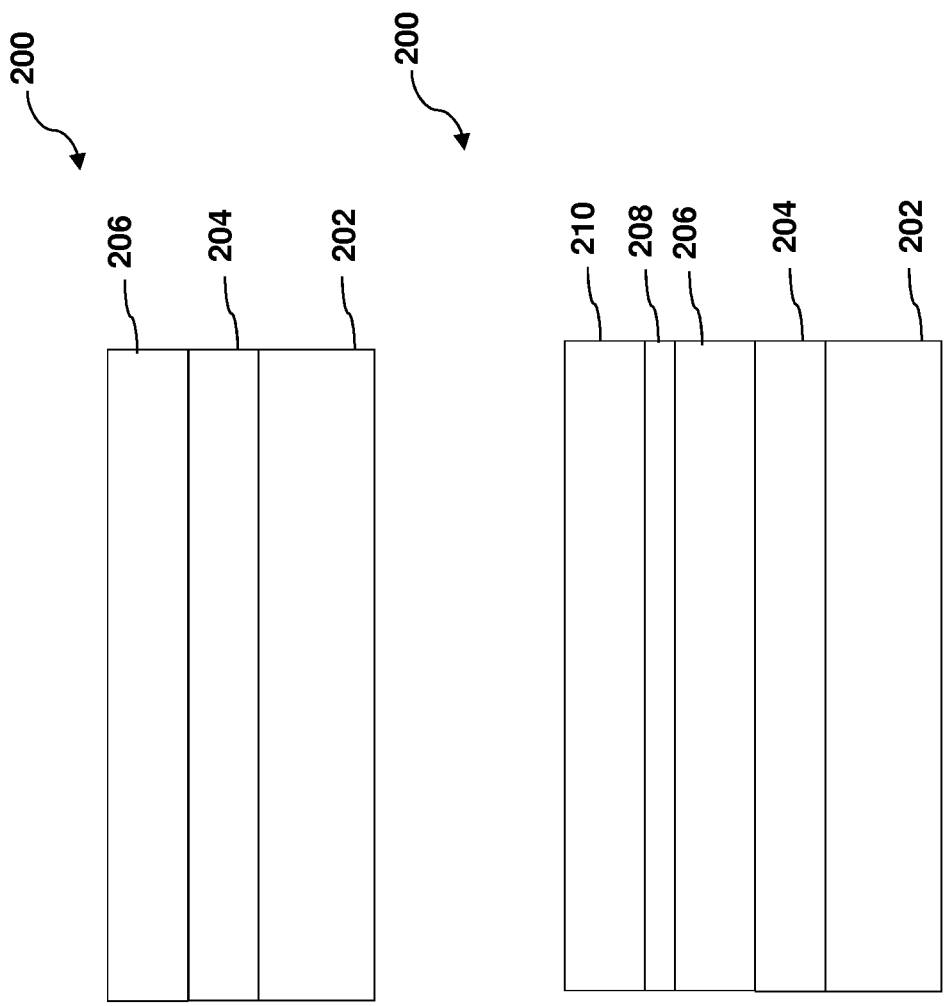

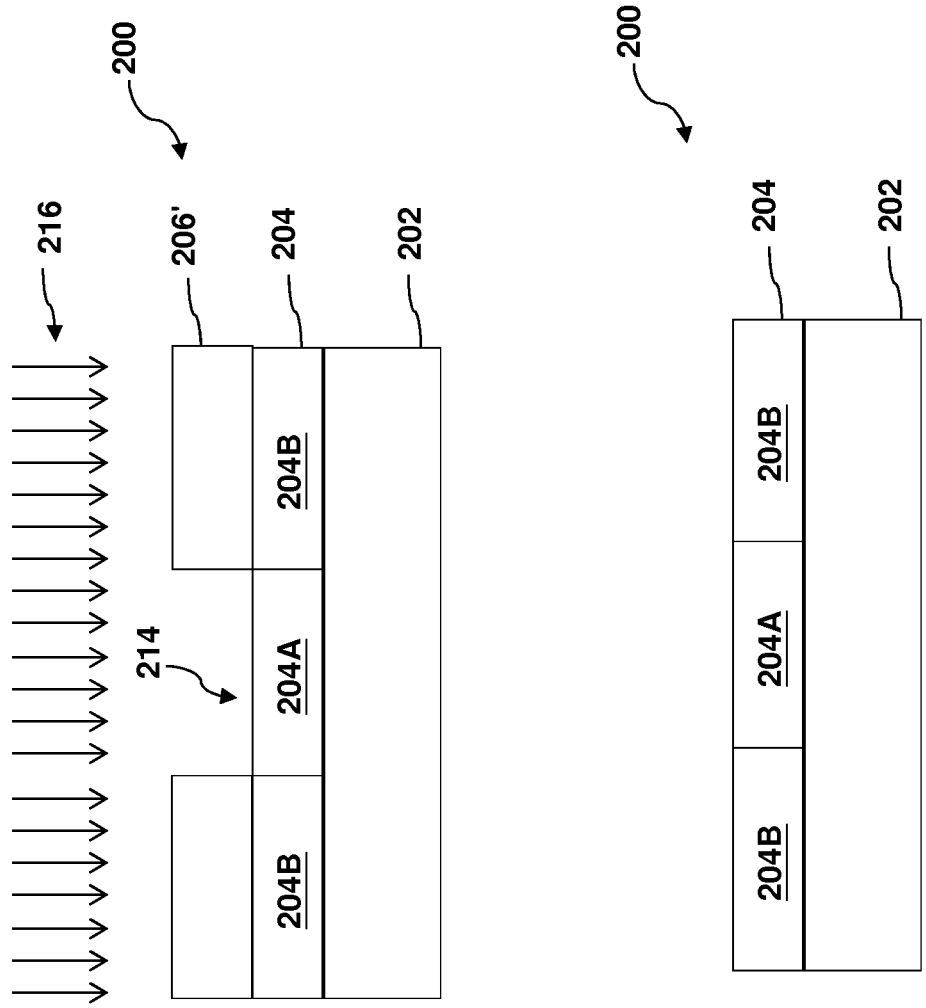

METHOD FOR INTEGRATED CIRCUIT PATTERNING

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC processing and manufacturing are needed.

For example, lithography is a technique frequently used in IC manufacturing for transferring an IC design to a semiconductor substrate. A typical lithography process includes forming a hard mask layer over a substrate, patterning the hard mask layer to form a hard mask, and etching the substrate using the hard mask as an etch mask. Patterning the hard mask layer typically includes coating a resist (or photoresist) over the hard mask layer, exposing the resist to a radiation such as deep ultraviolet (DUV) ray or extreme ultraviolet (EUV) ray, and developing and partially stripping the resist to leave a patterned resist over the hard mask layer. The patterned resist is then used in subsequent etching of the hard mask layer to form the hard mask. As the device miniaturization continues, there is frequently a need to produce island type small hard masks.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 2A, 2B, 2C, 2D, 2E, 2F, 2G, 2H, 2I, and 2J are cross sectional views of forming a target device according to the method of FIG. 1, in accordance with an embodiment.

DETAILED DESCRIPTION

Figure 1:
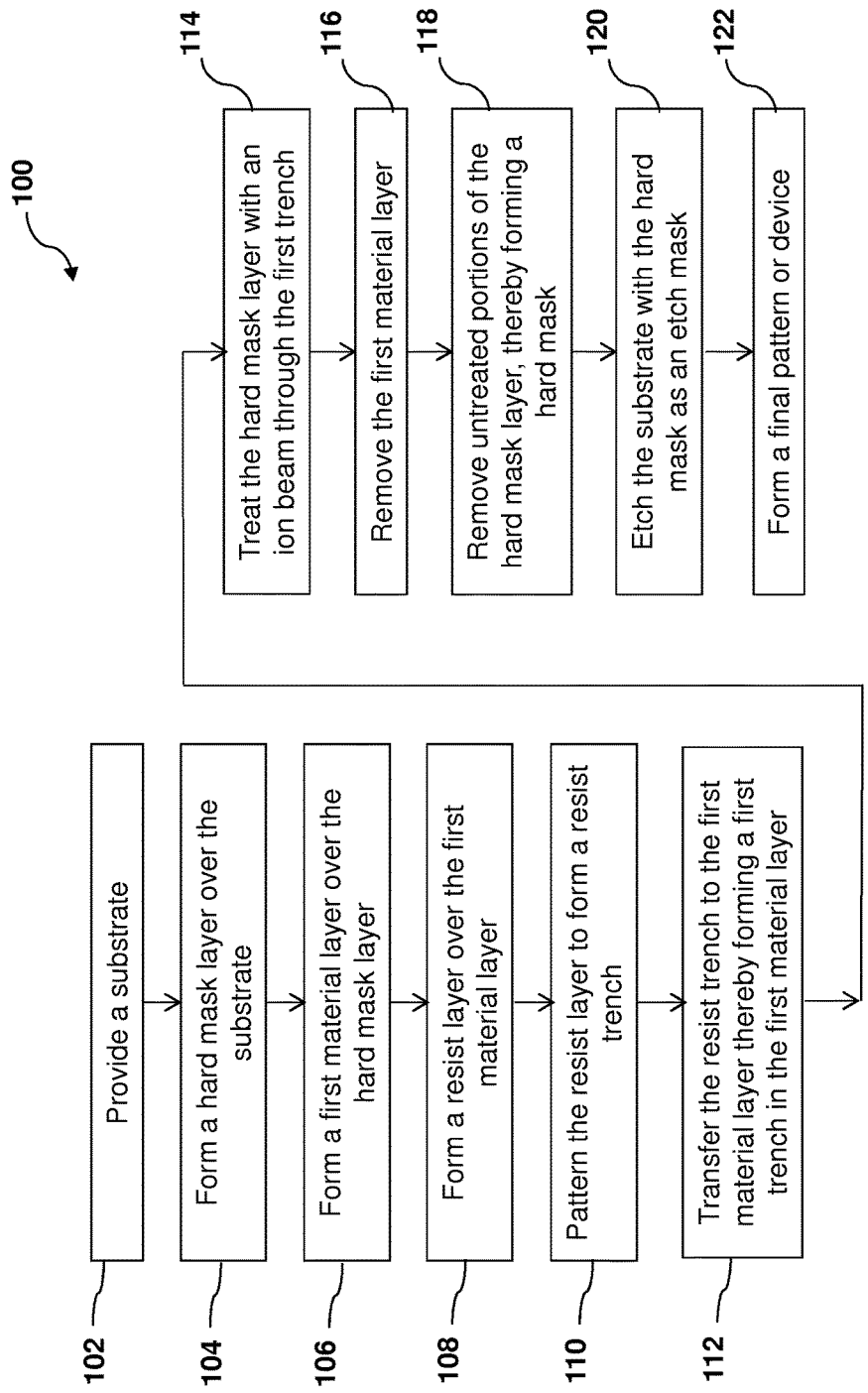
FIG. 1 is a flow chart of a method of forming a target pattern or device on a substrate for implementing one or more embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally related to forming a pattern or device for an integrated circuit (IC) using a lithography process. More particularly, the present disclosure is related to creating island type small hard masks for advanced IC fabrication processes.

FIG. 1 shows a flow chart of a method 100 for forming a target pattern or device according to various aspects of the present disclosure. Additional operations can be provided before, during, and after the method 100, and some operations described can be replaced, eliminated, or moved around for additional embodiments of the method. The method 100 is merely an example, and is not intended to limit the present disclosure beyond what is explicitly recited in the claims. The method 100 is described below in conjunction with FIGS. 2A-2J, which show schematic cross-sectional views of a device 200 at various stages of a manufacturing process. The device 200 may be an IC, or a portion thereof, that may comprise static random access memory (SRAM) and/or other logic circuits, passive components such as resistors, capacitors, and inductors, and active components such as p-type field effect transistors (PFET), n-type FET (NFET), metal-oxide semiconductor field effect transistors (MOSFET), complementary metal-oxide semiconductor (CMOS) transistors, bipolar transistors, high voltage transistors, high frequency transistors, other memory cells, and combinations thereof. The device 200 may include three-dimensional devices and multi-gate devices such as double gate FETs, FinFETs, tri-gate FETs, omega FETs, and gate-all-around (GAA) devices including vertical GAA devices and horizontal GAA devices.

At operation 102, the method 100 (FIG. 1) provides a substrate 202 as shown in FIG. 2A. Referring to FIG. 2A, in various embodiments, the substrate 202 includes one or more material layers. In an embodiment, the substrate 202 is a semiconductor substrate (e.g., wafer). In an embodiment, the substrate 202 includes silicon in a crystalline structure. In alternative embodiments, the substrate 202 includes other elementary semiconductors such as germanium; a compound semiconductor such as silicon carbide, gallium arsenide, indium arsenide, and indium phosphide; or an alloy semiconductor, such as silicon germanium carbide, gallium arsenic phosphide, or gallium indium phosphide. The substrate 202 may include a silicon on insulator (SOI) substrate, be strained/stressed for performance enhancement, include epitaxial regions, include isolation regions, include doped regions, include one or more semiconductor devices or portions thereof, include conductive and/or non-conductive layers, and/or include other suitable features and layers. For example, the substrate 202 may include fin-like field effect transistors (FinFETs).

At operation 104, the method 100 (FIG. 1) forms a hard mask layer 204 over the substrate 202. Referring to FIG. 2B, in the present embodiment, the hard mask layer 204 uses amorphous silicon (a-Si). In alternative embodiments, the hard mask layer 204 may use silicon oxide ($SiO_2$), silicon nitride (SiN), silicon oxynitride (SiON), silicon carbon nitride (SiCN), silicon carbide (SiC), other suitable materials, or a combination thereof. Further in the present embodiment, the hard mask layer 204 uses a layer of amorphous silicon having a thickness ranging from about 10 angstrom (Å) to about 2000 Å. The hard mask layer 204 may be formed by chemical vapor deposition (CVD), low pressure chemical vapor deposition (LPCVD), plasma enhanced chemical vapor deposition (PECVD), physical vapor deposition (PVD), atomic layer deposition (ALD), or other suitable deposition method. For example, the hard mask layer 204 may be formed by CVD using chemicals including Hexachlorodisilane (HCD or $Si_2Cl_6$), Dichlorosilane (DCS or $SiH_2Cl_2$), Bis(TertiaryButylAmino) Silane (BTBAS or $C_8H_{22}N_2Si$) and Disilane (DS or $Si_2H_6$).

At operation 106, the method 100 (FIG. 1) forms a first material layer 206 over the hard mask layer 204. Referring to FIG. 2C, the first material layer 206 uses a material different from the hard mask layer 204. In various embodiments, the first material layer 206 and the hard mask layer 204 have high etch selectivity. The first material layer 206 may contain silicon, hydrogen, oxygen, and/or carbon, such as spin-on glass (SOG). In an embodiment, the first material layer 206 is an under layer in a tri-layer photolithography. The first material layer 206 may be formed using CVD, PVD, spin-coating, or other suitable process.

At operation 108, the method 100 (FIG. 1) forms a resist layer 210 over the first material layer. Referring to FIG. 2D, in the present embodiment, prior to the forming of the resist layer 210, the method 100 forms a middle layer 208 on the first material layer 206. The middle layer 208 may be an anti-reflective coating (ARC) layer that includes a polymeric material layer or a silicon-containing material layer, such as silicon oxide, silicon oxygen carbide, and plasma enhanced chemical vapor deposited silicon oxide. In an alternative embodiment, the middle layer 208 contains carbon, hydrogen, and/or oxygen. The middle layer 208 may be formed by CVD, PVD, ALD, or other suitable methods. The resist layer 210 is formed on the middle layer 208. In an alternative embodiment, the resist layer 210 may be formed directly over the first material layer 206 without the middle layer 208. In various embodiments, the resist layer 210 is formed by a spin coating process followed by a soft baking process.

The resist layer 210 can be a positive resist or a negative resist. A positive resist is normally insoluble in a resist developer, but is made soluble by exposure to a radiation such as a deep ultraviolet (DUV) ray, an extreme ultraviolet (EUV) ray, an electron beam (e-beam), an x-ray, or other suitable radiation. One exemplary positive resist material is chemically amplified resist (CAR) that contains backbone polymer protected by acid labile groups (ALGs). A negative resist has the opposite behavior—normally soluble in a resist developer, but is made insoluble by exposure to a radiation, such as a DUV ray, an EUV ray, an e-beam, an x-ray, or other suitable radiation. One exemplary negative resist is a polymer which forms intra-molecular and/or intermolecular cross links when irradiated, such as a polymerization of Ethyl(α-hydroxy)acrylate (EHMA) and methacryl acid (MAA).

Figure 2E:
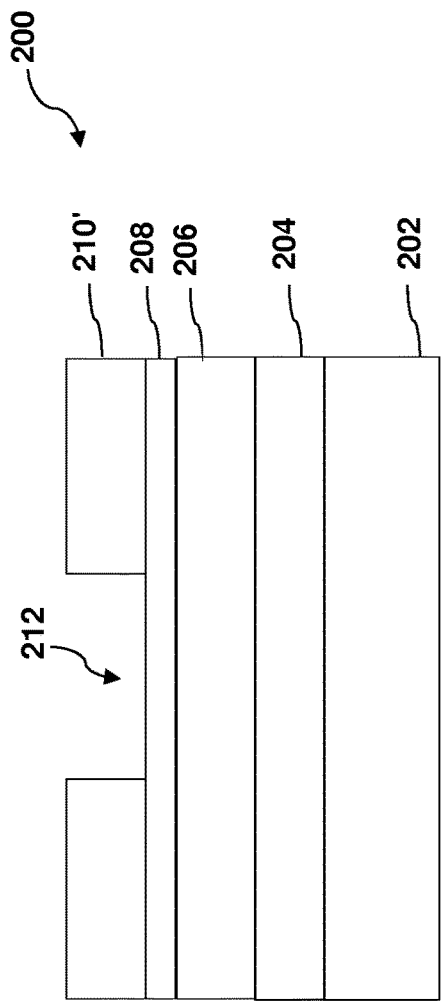

At operation 110, the method 100 (FIG. 1) patterns the resist layer 210 thereby forming a resist pattern 210'. Referring to FIG. 2E, in the present embodiment, the resist pattern 210' includes a trench 212, also referred to as a resist trench 212. To further the present embodiment, the resist trench 212 has small dimensions for forming an island type small hard mask in the hard mask layer 204.

An island type hard mask (i.e., a hard mask feature isolated from the rest of the hard mask features) is frequently used in IC fabrication. For example, when forming a contact layer for SRAM cells, a line-end cut mask is used for defining the final feature. The line-end cut mask is an island type mask. However, forming island type small hard masks for photolithography has been quite a challenge as the semiconductor process continues progressing to smaller nodes, such as 22 nm, 10 nm, or even smaller. One reason is that small resist patterns suffer from resist peeling issue. If the resist layer 210 is patterned to form island type small resist patterns, like in traditional photolithography processes, the island type small resist patterns do not attach to the underlayer (e.g., the middle layer 208) very well and could easily fall off during the photolithography process. This is undesirable. One approach to countering the resist peeling issue uses a reverse patterning method. In the reverse patterning method, first, a resist is patterned to have small resist trenches (such as the resist trench 212). Then, the resist trenches are transferred to a hard mask layer (such as the hard mask layer 204) to form hard mask trenches by etching the hard mask layer and any intermediate layers between the hard mask layer and the resist. Next, the hard mask trenches are overfilled with a dielectric material and a chemical mechanical planarization (CMP) process is performed to remove excessive dielectric material. Finally, the hard mask layer is removed by a selective etching process, leaving the dielectric material as an island type small mask. The reverse patterning method addresses the resist peeling issue. However, it has its own drawbacks. First, it incurs extra costs due to the use of the additional dielectric material and the associated deposition, CMP, and etching processes. Second, it may induce more defects in the fabricated devices due to the extra processing over the substrate (e.g., the hard mask layer is twice etched). The provided subject matter is superior to both the traditional island type resist patterning and the reverse patterning method, as will be discussed below.

Still referring to FIG. 2E, in an embodiment, the operation 110 (FIG. 1) patterns the resist layer 210 using a photo-mask (or a mask or a reticle). Alternatively, the operation 110 may use a maskless patterning technique such as electron beam direct writing (EBDW). In an embodiment, patterning the resist layer 210 includes exposing the resist layer 210 to a radiation, post-exposure baking, developing the resist layer 210 in a resist developer, and hard baking thereby removing exposed portion (or unexposed in the case of negative resist) of the resist layer 210 and leaving unexposed portions thereof on the middle layer 208 as the resist pattern 210'. The radiation may be a DUV ray, an EUV ray, an e-beam, an x-ray, an ion beam, or another suitable radiation. In embodiments where a photo-mask is used to pattern the resist layer 210, the photo-mask can be of different types, such as a transmissive mask or a reflective mask, and can be formed in various technologies, such as binary mask or phase shift mask (PSM). In one example, a binary mask includes a transparent substrate (e.g., fused quartz), and an opaque material (e.g., chromium) coated in the opaque regions of the mask. In another example, a PSM includes various features configured to have proper phase difference to enhance the resolution and imaging quality. In various embodiments, the resist layer 210 may be patterned to include any number of trench patterns and the trench patterns can be of any shapes and sizes.

At operation 112, the method 100 (FIG. 1) transfers the resist trench 212 to the first material layer 206, thereby forming a patterned first material layer 206'. In the present embodiment, the operation 112 includes etching the middle layer 208 and the first material layer 206 through the resist trench 212. The etching processes may include dry (plasma) etching, wet etching, and/or other etching methods. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof. For example, a wet etching process may use an etchant with diluted hydrofluoric acid (DHF), potassium hydroxide (KOH) solution, ammonia, or other suitable wet etchant. The one or more etching processes form a trench 214 in the first material layer 206. After the first material layer 206 has been etched, the resist pattern 210' and the middle layer 208 are removed. The resist pattern 210' may be removed, for example, by a wet etching process that uses a photoresist stripper, an aqueous alkaline solution, an amine-solvent mixture, or an organic solvent. The middle layer 208 may be removed by dry (plasma) etching, wet etching, and/or other etching methods that selectively tuned to remove the middle layer 208 while the patterned first material layer 206' remains substantially unchanged.

Figure 2F:
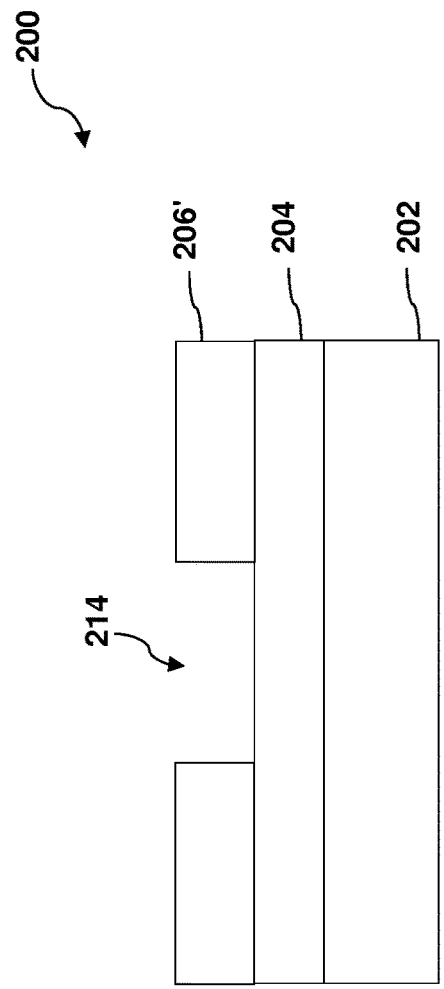

In the present embodiment, the first material layer 206 and the hard mask layer 204 have high etch selectivity. In another word, when the first material layer 206 is etched in an etching process (e.g., a dry etching process) to form the trench 214, the hard mask layer 204 remains substantially unchanged in the etching process. As a result of the operation 112, the trench 214 is formed in the first material layer 206 and exposes a portion of the hard mask layer 204, as shown in FIG. 2F.

At operation 114, the method 100 (FIG. 1) treats the hard mask layer 204 with an ion beam 216. Referring to FIG. 2G, the ion beam 216 is directed towards a top surface of the device 200. Since the patterned first material layer 206' partially covers the hard mask layer 204, only a portion of the hard mask layer 204 corresponding to or exposed by the trench 214 is treated by the ion beam 216. In the present embodiment, the treated portion(s) of the hard mask layer 204 is labeled as 204A while the untreated portion(s) of the hard mask layer 204 is labeled as 204B. In the present embodiment, the ion beam 216 reduces the etching rate of the treated portion 204A with respect to a target etchant. Particularly, the treated portion 204A attains a lower etching rate (or a higher etching resistance) with respect to the target etchant than the untreated portion 204B. In an embodiment, the hard mask layer 204 includes amorphous silicon, the ion beam 216 includes B ions or $BF_2$ ions, and the target etchant includes ammonium hydroxide or tetramethylammonium hydroxide. Experiments have shown that, after being treated with a B ion beam or a BF2 ion beam, the etching rate of amorphous silicon in ammonium hydroxide or tetramethylammonium hydroxide decreases dramatically. In one example, the etching rate decreases from about 200 Å per minutes (Å/min) to about 0 Å/min.

In an embodiment, the ion beam 216 is generated by an ion implanter as a focused ion beam. In an embodiment, the ion beam 216 is a B ion beam or a $BF_2$ ion beam and is provided with ion energy from about 1.0 kV to about 50 kV and ion dose from about $1E13$ ions/cm$^2$ to about $1E16$ ions/cm$^2$. In alternative embodiments, the ion beam 216 may include one of the following ion species: C, P, In, Ge, As, Si, and Yb. Further, the ion beam 216 may be directed towards the hard mask layer 204 with a tilt angle ranging from 0 degree (normal to the top surface of the device 200) to about 45 degrees (on both sides of the normal), and with a suitable twist angle. In embodiments, the ion beam treatment of the hard mask layer 204 may be performed in temperature ranging from −100 degrees Celsius to about 100 degrees Celsius, and for about 3 seconds to about 600 seconds.

The patterned first material layer 206' effectively blocks the ion beam 216 from reaching the hard mask layer 204, except through the trench 214. In an embodiment, the etching rate of the patterned first material layer 206' remains substantially unaffected by the ion beam 216. Further, the patterned first material layer 206' and the hard mask layer 204 (including the treated and untreated portions) still have sufficient etch selectivity in an etching process.

In an embodiment, it is desirable to keep the substrate 202 substantially unaffected by the ion beam 216. To further this embodiment, the thickness of the hard mask layer 204 and the characteristics of the ion beam 216 (such as ion energy, ion dose, beam tilt and twist angles) are carefully designed so that the ion beam 216 thoroughly treats the hard mask layer portion 204A but does not (or insignificantly) penetrate the substrate 202.

In an embodiment, the operation 114 further includes an annealing process after the hard mask layer 204 has been treated with the ion beam 216. For example, the annealing process may include a microsecond annealing (µSSA) process, a microwave annealing (MWA) process, a rapid thermal annealing (RTA) process, and/or other suitable annealing processes. The annealing process may improve the critical dimension and the profile of the treated portion 204 and, accordingly, the final island type small hard mask.

At operation 116, the method 100 (FIG. 1) removes the patterned first material layer 206' using an etching process that may include dry (plasma) etching, wet etching, and/or other etching methods. For example, a dry etching process may implement an oxygen-containing gas, a fluorine-containing gas, a chlorine-containing gas, a bromine-containing gas, an iodine-containing gas, other suitable gases and/or plasmas, and/or combinations thereof. For example, a wet etching process may use an etchant with diluted hydrofluoric acid (DHF), potassium hydroxide (KOH) solution, ammonia, or other suitable wet etchant. In the present embodiment, the etching process is tuned to selectively remove the patterned first material layer 206' while the hard mask layer 204, including both the treated portion 204A and the untreated portion 204B, remains substantially unchanged, as shown in FIG. 2H.

Figure 2I:
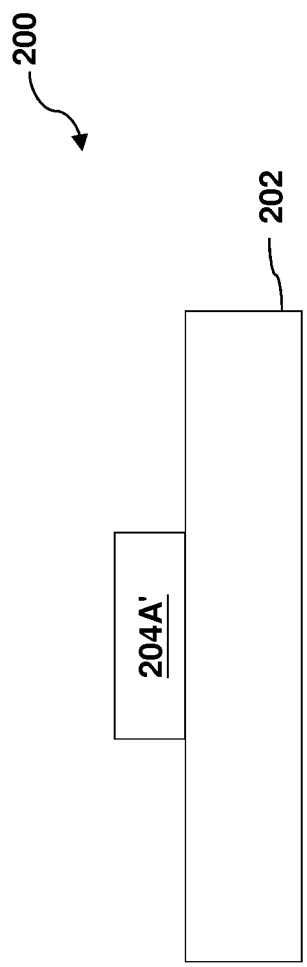

At operation 118, the method 100 (FIG. 1) removes the untreated portion 204B of the hard mask layer 204. The etching processes may include dry (plasma) etching, wet etching, and/or other etching methods. In the present embodiment, the hard mask layer 204 includes amorphous silicon and the etching process uses ammonium hydroxide or tetramethylammonium hydroxide as an etchant. Due to the ion beam treatment in the operation 114, the treated portion 204A and the untreated portion 204B have high etch selectivity in the etching process. As a result, the untreated portion 204B is removed by the etching process while the treated portion 204A remains substantially unchanged and becomes a hard mask 204A' over the substrate 202. Depending on the etch selectivity between the treated and untreated portions 204A and 204B, the hard mask 204A' may be the same or substantially the same as the treated portion 204A. Referring to FIG. 2I, shown therein is the device 200 with the hard mask 204A' over the substrate 202. In the present embodiment, the hard mask 204A' is an island type small hard mask for etching the substrate 202. Compared to traditional approaches for forming an island type small hard mask, the provided subject matter has many advantages. First, the provided subject matter overcomes the resist peeling issue because the mask feature is formed as a resist trench (e.g., the resist trench 212). Second, the provided subject matter forms the island type small hard mask directly in the hard mask layer (e.g., the hard mask layer 204) and does not require a reverse material and the associated processes. Therefore, the provided subject matter is more cost-effective in addition to other benefits.

Figure 2J:
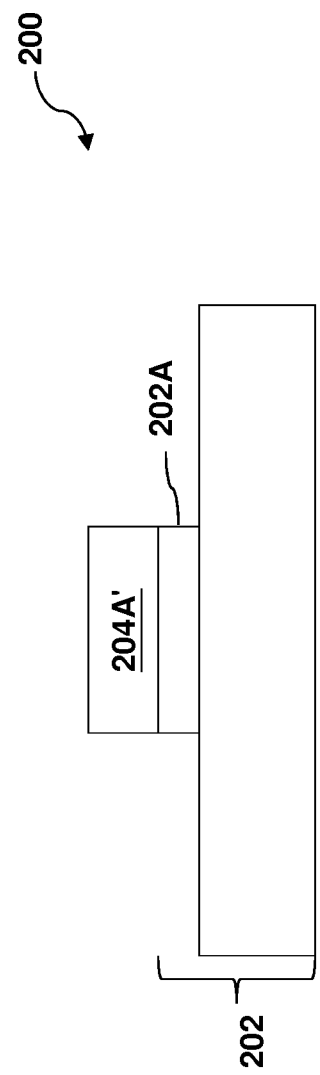

At operation 120, the method 100 (FIG. 1) etches the substrate 202 with the hard mask 204A' as an etch mask. Referring to FIG. 2J, shown therein is the device 200 with the substrate 202 etched. The hard mask 204A' serves as an etch mask and protects a portion 202A of the substrate 202 from being etched. In the present embodiment, the portion 202A forms an island type small feature on the substrate 202. The substrate 202 may be etched using a dry etching, wet etching, reactive ion etching, and/or other etching methods. In another embodiment, the hard mask 204A' is used as a cut mask in a mandrel-cut process. In a mandrel-cut process, a mandrel mask defines a mandrel pattern in a first exposure and a cut mask defines a cut pattern (such as the hard mask 204A') in a second exposure. For example, the mandrel pattern may be fins for FinFETs, contact lines in SRAM cells, etc. The cut pattern defines areas to be removed from the mandrel pattern or its derivatives. The final pattern includes the mandrel pattern plus the derivatives but not the cut pattern. It is noted that the provided subject matter can be used in forming any type of hard masks, not limited to island type small hard masks. In that regard, the hard mask 204A' may be of any shape and sizes and may be used by the method 100 in forming various IC features, such as isolation features, source and drain features, gate stacks, contacts, vias, and metal interconnects. The hard mask 204A' may be removed after the substrate 202 has been etched, for example, by a dry etching, wet etching, or other etching methods.

At operation 122, the method 100 (FIG. 1) performs further steps to complete the fabrication of the device 200. For example, the method 100 may form active devices, such as transistors, in and on the substrate 202; form high-k metal gate stacks; form multilayer interconnect structures; and form logic circuits and/or memory cells with various active and passive devices.

Although not intended to be limiting, the present disclosure provides many benefits to the fabrication of an IC. For example, embodiments of the present disclosure can be advantageously used for forming island type small hard masks. Compared to traditional approaches for forming island type small hard masks, the provided subject matter overcomes the resist peeling issue because the hard mask is first formed as a resist trench. Further, the provided subject matter forms the island type small hard mask directly in a hard mask layer without a need for a reverse material filling and the associated processes (such as deposition, CMP, and etching). As a result, the provided subject matter saves costs in material and handling and helps reduce defects in the final IC device. The provided subject matter can be easily integrated into existing IC manufacturing flow and be used for forming all kinds of etch masks, not limited to island type small hard mask. In fact, the specific embodiments discussed so far are only examples and do not limit the inventive scope of the present disclosure beyond what is explicitly recited in the claims.

In one exemplary aspect, the present disclosure is directed to a method of patterning a substrate. The method includes forming a hard mask layer over the substrate; forming a first material layer over the hard mask layer; and forming a trench in the first material layer. The method further includes treating the hard mask layer with an ion beam through the trench, wherein an etching rate of a treated portion of the hard mask layer reduces with respect to an etching process while an etching rate of untreated portions of the hard mask layer remains substantially unchanged with respect to the etching process. The method further includes removing the first material layer after the treating of the hard mask layer. The method further includes removing the untreated portions of the hard mask layer with the etching process, thereby forming a hard mask over the substrate. The method further includes etching the substrate with the hard mask as an etch mask.

In another exemplary aspect, the present disclosure is directed to a method of patterning a substrate. The method includes forming a hard mask layer over the substrate, wherein the hard mask layer includes amorphous silicon. The method further includes forming a first material layer over the hard mask layer and forming a trench in the first material layer, the trench exposing a first portion of the hard mask layer. The method further includes treating the first portion with an ion beam, thereby reducing an etching rate of the first portion with respect to an etchant while an etching rate of untreated portions of the hard mask layer remains substantially unchanged with respect to the etchant. The ion beam is one of: a B ion beam and a $BF_2$ ion beam. The method further includes removing the first material layer after the treating of the first portion. The method further includes removing the untreated portions of the hard mask layer with the etchant, thereby forming a hard mask over the substrate, and etching the substrate with the hard mask as an etch mask.

In yet another exemplary aspect, the present disclosure is directed to a method of patterning a substrate. The method includes forming a hard mask layer over the substrate, wherein the hard mask layer includes amorphous silicon; and forming a first material layer over the hard mask layer. The method further includes forming a trench in the first material layer, the trench exposing a first portion of the hard mask layer. The method further includes treating the first portion with an ion beam, thereby reducing an etching rate of the first portion with respect to an etchant while an etching rate of untreated portions of the hard mask layer remains substantially unchanged with respect to the etchant. The ion beam is one of: a B ion beam and a $BF_2$ ion beam. The etchant includes one of: ammonium hydroxide and tetramethylammonium hydroxide. The method further includes removing the first material layer after the treating of the first portion. The method further includes removing the untreated portions of the hard mask layer with the etchant, thereby forming a hard mask over the substrate; and etching the substrate with the hard mask as an etch mask.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method of patterning a substrate, the method comprising:
   forming a hard mask layer over the substrate;
   forming a patterned material layer over the hard mask layer, wherein the patterned material layer exposes a portion of the hard mask layer;
   treating the hard mask layer with an ion beam, such that an etching rate of the exposed portion of the hard mask layer reduces with respect to an etching process while an etching rate of an unexposed portion of the hard mask layer remains substantially unchanged with respect to the etching process;
   after the treating the hard mask layer, removing the patterned material layer and performing an annealing process on the treated hard mask layer;
   after the annealing process, removing the unexposed portion of the hard mask layer with the etching process, thereby forming a hard mask; and
   etching the substrate with the hard mask as an etch mask.

2. The method of claim 1, wherein the ion beam is provided with a tilt angle in a range from about 0 degree to about 45 degrees.

3. The method of claim 1, wherein the hard mask layer includes amorphous silicon (a-Si).

4. The method of claim 1, wherein the etching process uses ammonium hydroxide or tetramethylammonium hydroxide.

5. The method of claim 4, wherein the patterned material layer includes silicon, hydrogen, oxygen, carbon, or a combination thereof.

6. The method of claim 1, wherein the hard mask layer includes silicon oxide ($SiO_2$), silicon nitride (SiN), silicon oxynitride (SiON), silicon carbon nitride (SiCN), silicon carbide (SiC), or a combination thereof.

7. The method of claim 1, wherein the removing the patterned material layer uses another etching process that selectively removes the patterned material layer while the hard mask layer remains substantially unchanged.

8. The method of claim 1, wherein the forming the patterned material layer includes:
   forming a material layer over the hard mask layer;
   forming a resist layer over the material layer;
   patterning the resist layer to form a resist trench; and
   transferring the resist trench to the material layer.

9. The method of claim 8, wherein the forming the patterned material layer further includes:
   forming an anti-reflective coating layer over the material layer before forming the resist layer.

10. The method of claim 1, wherein the annealing process is a microsecond annealing process, a microwave annealing process, a rapid thermal annealing process, or a combination thereof.

11. The method of claim 1, wherein the substrate remains substantially unaffected by the ion beam.

12. The method of claim 1, wherein an etching rate of the patterned material layer remains substantially unaffected by the ion beam.

13. The method of claim 1, wherein the ion beam includes B, C, P, In, Ge, As, Si, Yb, or a combination thereof.

14. A method of patterning a substrate, the method comprising:
   forming an amorphous silicon layer over the substrate;
   treating the amorphous silicon layer with a boron-containing ion beam, thereby reducing an etching rate of a first portion of the amorphous silicon layer with respect to a hydroxide-containing etchant while an etching rate of a second portion of the amorphous silicon layer remains substantially unchanged with respect to the hydroxide-containing etchant;
   annealing the treated amorphous silicon layer;
   after the annealing, performing a first etching process with the hydroxide-containing etchant to remove the second portion of the amorphous silicon layer; and
   performing a second etching process to remove an exposed portion of the substrate.

15. The method of claim 14, wherein the substrate remains substantially unaffected by the boron-containing ion beam.

16. The method of claim 14, wherein the hydroxide-containing etchant is ammonium hydroxide or tetramethylammonium hydroxide.

17. A method of patterning a substrate, the method comprising:
   forming a hard mask layer over the substrate;
   forming a patterned material layer over the hard mask layer;
   treating the hard mask layer with a boron-containing ion beam using the patterned material layer as a mask, thereby reducing an etching rate of a treated portion of the hard mask layer with respect to an etchant while an etching rate of an untreated portion of the hard mask layer remains substantially unchanged with respect to the etchant, wherein the etchant includes ammonium hydroxide or tetramethylammonium hydroxide;
   selectively etching the patterned material layer;
   annealing the treated hard mask layer;
   after the annealing, selectively etching the untreated portion of the hard mask layer with the etchant, thereby forming a hard mask; and
   selectively etching the substrate with the hard mask as an etch mask.

18. The method of claim 17, wherein the annealing is a microsecond annealing process, a microwave annealing process, a rapid thermal annealing process, or a combination thereof.

19. The method of claim 17, wherein the patterned material layer includes spin on glass.

20. The method of claim 17, wherein the hard mask layer includes amorphous silicon.

* * * * *